(12) United States Patent
Pratt

(10) Patent No.: US 6,356,222 B1
(45) Date of Patent: Mar. 12, 2002

(54) CIRCUIT TO INCREASE THE PRECISION OF A DIGITAL-TO-ANALOG CONVERTER

(75) Inventor: Stephen J. Pratt, Cumming, GA (US)

(73) Assignee: Matsushita Mobile Communication Development Corporation of USA, Suwanee, GA (US)

( * ) Notice: Subject to any disclaimer, the term of this patent is extended or adjusted under 35 U.S.C. 154(b) by 0 days.

(21) Appl. No.: 09/564,484

(22) Filed: May 4, 2000

(51) Int. Cl.$^7$ ................................................. H03M 1/66
(52) U.S. Cl. ........................................ 341/144; 341/143
(58) Field of Search ................................... 341/144, 148, 341/153, 145, 154, 136, 150, 141, 172

(56) References Cited

U.S. PATENT DOCUMENTS

| | | | |
|---|---|---|---|
| 5,079,552 A | * | 1/1992 | Pelgrom et al. ............ 341/148 |
| 5,252,975 A | * | 10/1993 | Yuasa et al. ................ 341/145 |
| 5,604,501 A | * | 2/1997 | McPartland ................ 341/144 |
| 5,745,065 A | * | 4/1998 | Wu ............................ 341/144 |
| 5,859,606 A | * | 1/1999 | Schrader et al. ........... 341/144 |

* cited by examiner

Primary Examiner—Peguy Jeanpierre
Assistant Examiner—Joseph Lauture

(57) ABSTRACT

A circuit for increasing the precision of an N-bit digital-to-analog converter. The N-bit digital-to-analog converter includes a digital signal input and an analog signal output. The analog signal output connects to the analog signal input of a translating circuit. The translating circuit includes an analog signal output and a bias enable input. The N-bit digital-to-analog converter receives an N-bit digital signal and converts it into a first analog output signal having $2^n$ possible values over a first voltage range. When the enable input is in an enabled state, the translating circuit translates the first analog output signal into a second analog voltage having $2^n$ possible values over a second voltage range, the second voltage range having a smaller maximum value than maximum value of the first voltage range. When the enable input is in a disabled state, the translating circuit translates the first analog output signal into the second analog voltage having $2^n$ possible values over a third voltage range, the third voltage range having a larger minimum value than the minimum value of the first voltage range. As a result, the full precision range of the N-bit digital-to-analog converter is applied to two voltage ranges within the original voltage range of the N-bit digital-to-analog converter. Thus, the precision of the N-bit digital-to-analog converter is increased.

12 Claims, 5 Drawing Sheets

CIRCUIT TO INCREASE THE PRECISION OF A DIGITAL-TO-ANALOG CONVERTER

TECHNICAL FIELD

This invention relates to the field of digital-to-analog converters and, more particularly, relates to expanding the precision of a digital-to-analog converter that is limited to a finite number of bits.

BACKGROUND

In the computer and telecommunications context, it is well known that electrical data signals are frequently characterized as being in either analog or digital form. In addition, the use of devices to convert electrical signals from one form to the other have been known for many years. These converters, known generally as either "digital-to-analog" converters or "analog-to-digital" converters, are used for a variety of purposes and in a variety of applications, including modems, telephones, music and video recording and reproduction equipment, and virtually any electronic device that must interface with multiple types of technology such as digital or analog technology.

Micro-controllers, a microprocessor and other general circuitry on the same substrate, often provide digital-to-analog or analog-to-digital circuitry. In addition, integrated circuit manufactures often incorporate digital-to-analog and/or analog-to-digital capabilities into general purpose and custom integrated circuits. In such micro-controllers and custom integrated circuits, the designers are typically limited in the amount of space or circuitry that can be included on a single substrate or the number of input and output pins of the integrated circuit. Due to these and other constraints, the precision of digital-to-analog and analog-to-digital converters are often limited. A typical digital-to-analog or analog-to-digital converter will be limited to a certain number of bits, such as eight bits.

When a product designer uses a micro-controller or a general purpose integrated circuit, the designer is limited to the precision of the analog-to-digital or digital-to-analog converter that is included with the integrated circuit. However, in certain circumstances, a higher degree of precision may be required than what is provided with the analog-to-digital or digital-to-analog converter provided with the micro-controller or general purpose integrated circuit. When such a design situation arises, the designer is forced to either utilize an external analog-to-digital or digital-to-analog converter, or try to find an integrated circuit with a more precise analog-to-digital or digital-to-analog converter.

One typical situation in which this arises is when a digital-to-analog converter is used to control the frequency of a transmitter. For example, a newer 1900 megahertz telephone, when compared to an older 800 megahertz phone, requires an increased frequency resolution that is small enough to meet a 200 hertz maximum error for a TMDA signal. This control range could be accomplished in older 800 megahertz telephones by utilizing an 8-bit digital-to-analog converter. While continuing to use an 8-bit digital-to-analog converter with the high-band telephone, it is not possible to obtain a small enough frequency increment range to control the accuracy of the signal. Thus, it is clear that there is a need in the art for method to expand the precision of an digital-to-analog converter without requiring a complete redesign of a product by forcing the selection of a new integrated circuit with an digital-to-analog converter having a higher precision.

SUMMARY OF THE INVENTION

The present invention solves the above-described problem by providing a circuit for increasing the precision or resolution of a digital-to-analog converter by utilizing a simple and elegant circuit external to the digital-to-analog converter.

More specifically, the present invention includes a circuit for increasing the precision of a digital-to-analog converter. The circuit includes an N-bit digital-to-analog converter having a digital signal input and an analog signal output and a translating circuit having an analog signal input electrically coupled to the analog signal output of the N-bit digital-to-analog converter, an analog signal output and a bias enable input. In operation, the N-bit digital-to-analog converter receives an N-bit digital signal on the digital signal input and converts the N-bit digital signal into a first analog output signal having $2^N$ possible values over a first voltage range. This signal is then provided to the output of the N-bit digital-to-analog converter.

When the bias enable input is in a first state, the translating circuit translates the first analog output signal into a second analog voltage having $2^N$ possible values over a second voltage range. This second voltage range has a smaller maximum value than maximum value of the first voltage range. When the bias enable input is in a second state, the translating circuit translates the first analog output signal into a second analog voltage having $2^N$ possible values over a third voltage range. This third voltage range has a larger minimum value than the minimum value of the first voltage range. Thus, precision of the digital-to-analog converter is available for two ranges that are smaller than the original range, thereby increasing the precision of the digital-to-analog converter.

DETAILED DESCRIPTION OF THE INVENTION

The present invention includes a method and a circuit for increasing the precision of a digital-to-analog converter. The increased precision is obtained by utilizing a voltage divider to limit the total range of the analog output voltage of the digital-to-analog converter to a sub-range, and then using a bias voltage to increase the voltage range of the analog output voltage. The full range of precision of the digital-to-analog converter is used to generate the sub-range voltage. The bias voltage allows the sub-range voltage to be shifted to various levels and thereby cover the total range. Thus, the total range is composed of two or more sub-ranges, with each sub-range having the full precision of the analog-to-digital converter. As a result, the precision of the digital-to-analog converter is increased.

Figure 1:
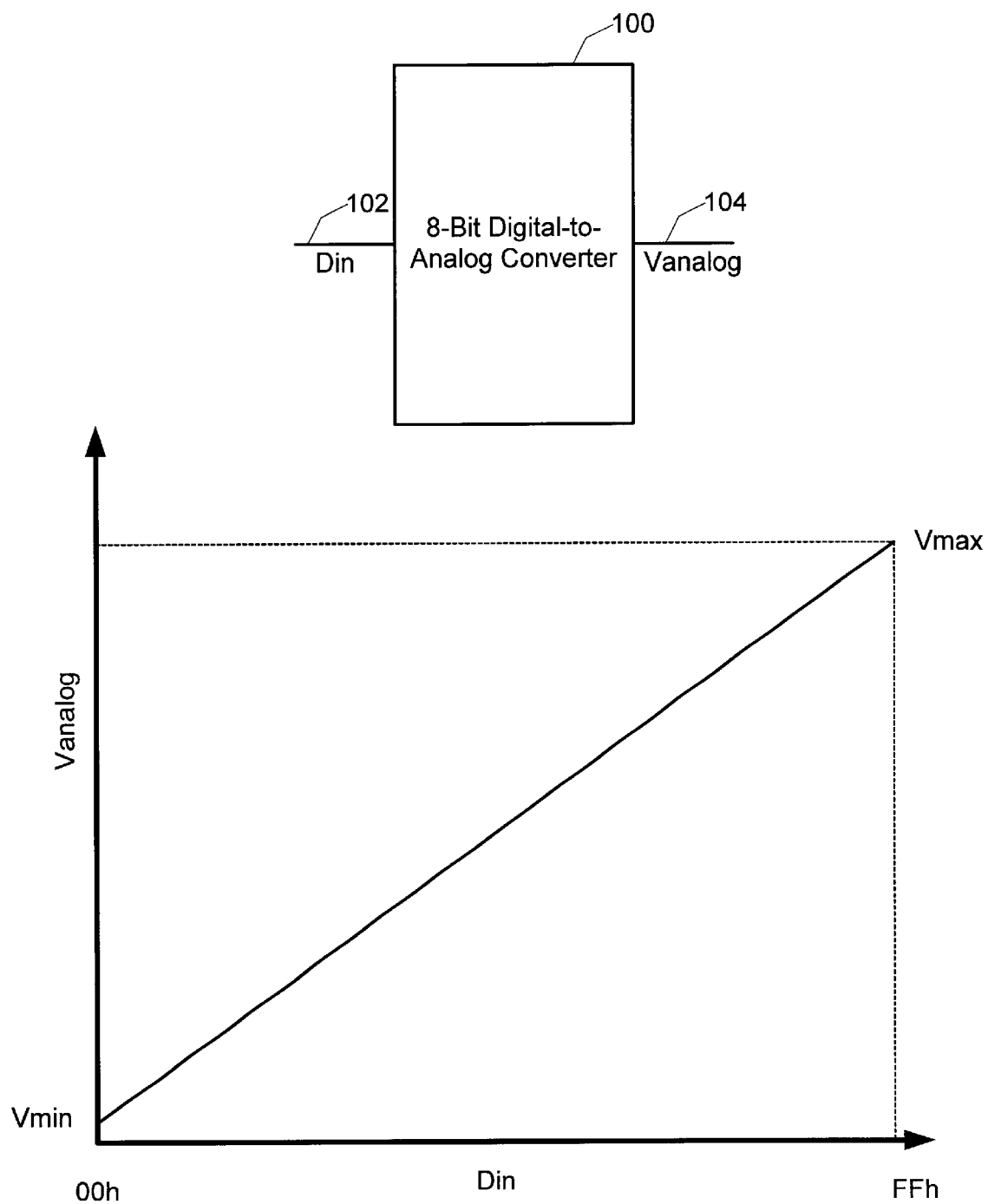
FIG. 1 is a diagram illustrating the typical operation of a prior art eight-bit digital-to-analog converter.

Referring now to the drawings in which like numerals and labels refer to like elements throughout the several views, FIG. 1 is a diagram illustrating the typical operation of a prior art eight-bit digital-to-analog converter. The digital input 102 of the eight-bit digital-to-analog converter 100 ranges from 0 to 256 (00h to FFh). The analog output voltage of the digital-to-analog converter ranges from Vmin to Vmax, the total range. The precision of the digital-to-analog converter can be expressed in terms of a voltage to bit-change ratio. The precision of an N-bit digital-to-analog converter can be expressed as: $(Vmax-Vmin)/2^N$ volts/bit-change. Thus, the prior-art eight-bit digital-to-analog converter has a precision of: $(Vmax-Vmin)/256$ volts/bit-change.

Figure 2:
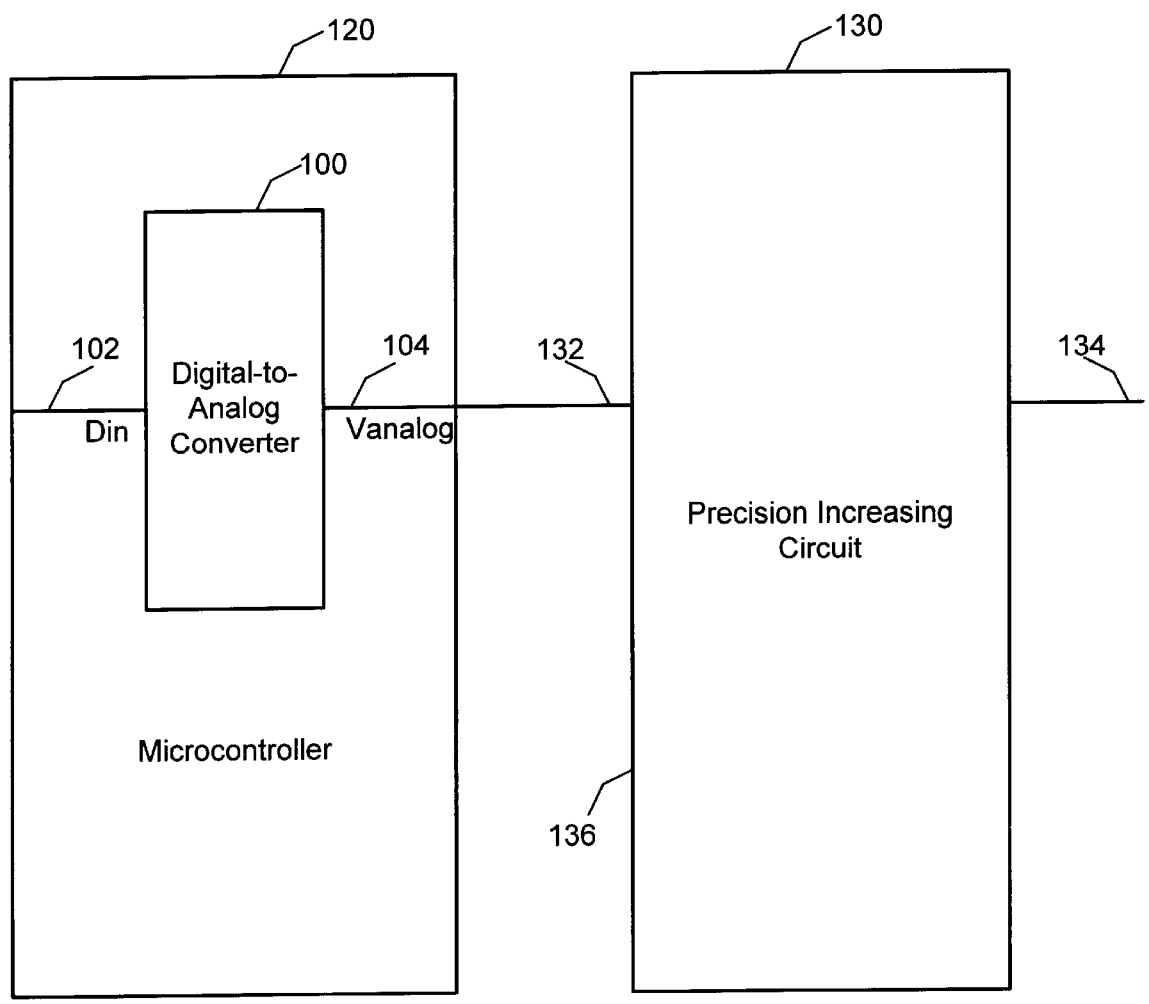
FIG. 2 is a block diagram illustrating an exemplary embodiment of the present invention.

FIG. 2 is a block diagram illustrating an exemplary embodiment of the present invention. Although the present invention will be described in terms of increasing the precision of an eight-bit digital-to-analog converter, it will be understood by those skilled in the art that the present invention may be applied to improve the precision of any sized digital-to-analog converter. The exemplary embodiment illustrated in FIG. 2 includes an eight-bit digital-to-analog converter 100 housed within a general purpose integrated circuit 120 (i.e., an Amithyst RISC Microcontroller (ARM) processor), and a precision increasing circuit 130. The digital-to-analog converter 100 includes an eight-bit digital input 102 that is either loaded through a serial or parallel bus, and an analog output 104. The precision increasing circuit 130 includes an analog input 132, an analog output 134 and a biasing input 136. The analog output 104 of the digital-to-analog converter 100 is provided to the analog input 132 of the precision increasing circuit 130. The general purpose integrated circuit 120, or some other means, provides a biasing signal to the biasing input 136 of the precision increasing circuit 130. In one embodiment, the biasing input 136 may accept a boolean signal (i.e., on or off). In an alternative embodiment, the biasing input 136 may accept a plurality of voltage levels. The operation both of these embodiments are provided.

In operation of the embodiment supporting a boolean biasing input 136, initially, the digital-to-analog converter 100 is set to produce a particular analog signal at the analog output 104 and the biasing input 136 is set to the disable condition. The precision increasing circuit 130 will receive the analog signal at its analog input 132 and provide a reduced voltage, proportional to analog signal, at its analog output 134. By adjusting the input to the digital-to-analog converter 100 from its minimal value 00h to its maximum value FFh, the analog signal at the analog output 104 will range from a minimum voltage Vmin to a maximum voltage Vmax. In addition, the reduced voltage available at the analog output 134 of the precision increasing circuit 130 will range from a minimum voltage $V_1$min to a maximum voltage $V_1$max. When the biasing input 136 is changed to the on condition, the analog output 134 of the precision increasing circuit 130 will be biased with an offset value. Thus, in the biased condition, the analog output 134 will range from a minimum voltage $V_2$min to a maximum voltage $V_2$max. It can then be seen that by using the present invention, the analog output 134 of the precision increasing circuit 130 can range from $V_1$min to $V_2$max. Furthermore, the $V_1$min to $V_2$max range consists of two sub-ranges ($V_1$min to $V_1$max and $V_2$min to $V_2$max) with each sub-range being adjustable with the full precision of the digital-to-analog converter 100. By minimizing the overlap of the sub-ranges, the precision of the digital-to-analog converter 100 is maximized over the $V_1$min to $V_2$max range.

In operation of the embodiment supporting a plurality of levels for the biasing input 136, assume initially, that the digital-to-analog converter 100 is set to produce a particular analog signal at the analog output 104 and the biasing input 136 is set to the lowest level. The precision increasing circuit 130 will receive the analog signal at its analog input 132 and provide a reduced voltage, proportional to analog signal, at its analog output 134. By adjusting the input to the digital-to-analog converter 100 from its minimal value 00h to its maximum value FFh, the analog signal at the analog output 104 will range from a minimum voltage Vmin to a maximum voltage Vmax. In addition, the reduced voltage available at the analog output 134 of the precision increasing circuit 130 will range from a minimum voltage $V_1$min to a maximum voltage $V_1$max. When the level of the voltage at the biasing input 136 is increased, the analog output 134 of the precision increasing circuit 130 will be biased with an offset value. Thus, in the biased condition, the analog output 134 will range from a minimum voltage $V_2$min to a maximum voltage $V_2$max. Similarly, when the level of the voltage at the biasing input 136 is increased to the $n^{th}$ level, the analog output 134 will range from a minimum voltage $V_n$min to a maximum voltage $V_n$max. It can then be seen that by using the present invention, the analog output 134 of the precision increasing circuit 130 can range from $V_1$min to $V_n$max. Furthermore, the $V_1$min to $V_n$max range consists of n sub-ranges ($V_1$min to $V_1$max to $V_n$min to $V_n$max) with each sub-range being adjustable with the full precision of the digital-to-analog converter 100. By minimizing the overlap of the sub-ranges, the precision of the digital-to-analog converter 100 is maximized over the $V_1$min to $V_2$max range.

Figure 3:
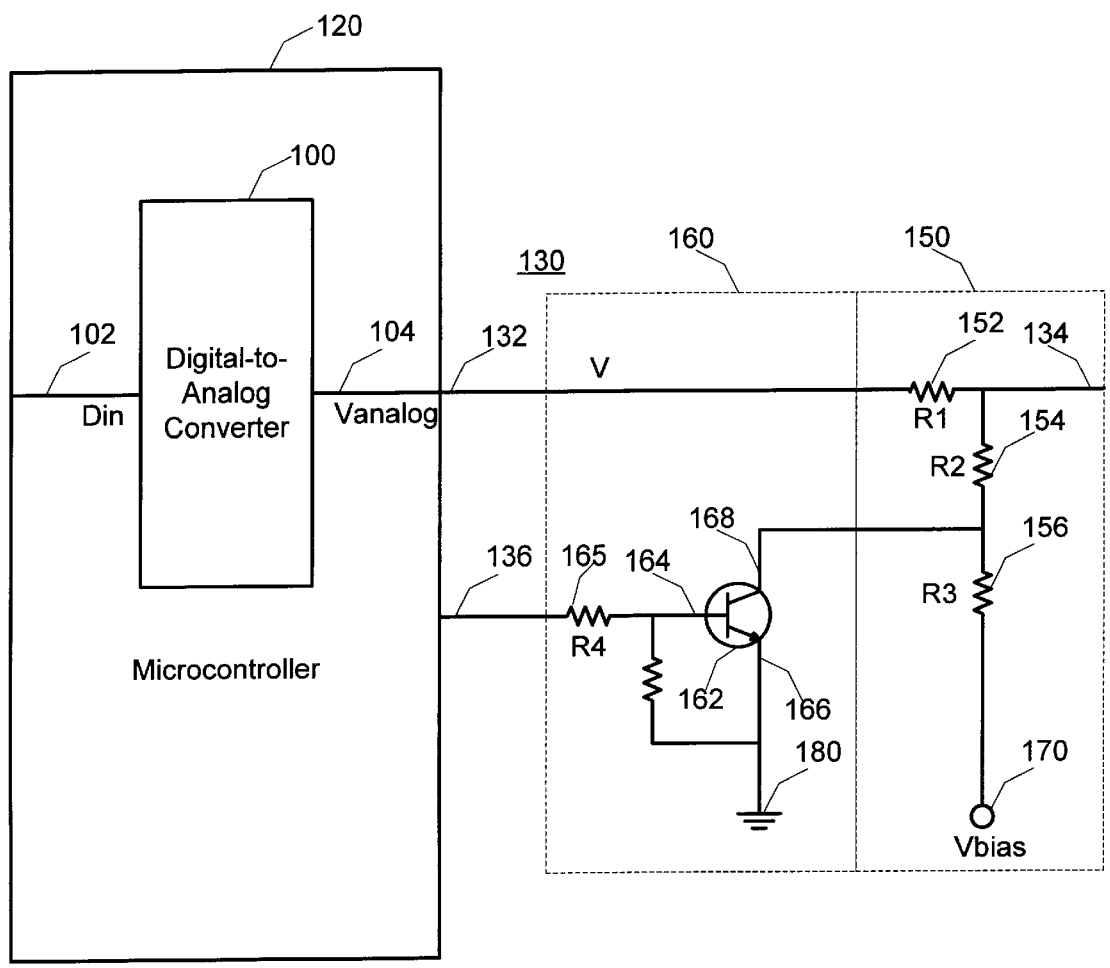
FIG. 3 is a circuit diagram illustrating an exemplary embodiment of the present invention.

FIG. 3 is a circuit diagram illustrating an exemplary embodiment of the present invention. The precision increasing circuit 130 is shown as including a voltage divider 150 and a biasing circuit 160. In this embodiment, the voltage divider includes three resistors (R1, R2 and R3). Although a resistor based voltage divider is illustrated in this exemplary embodiment of the present invention, those skilled in the art will appreciate that other forms of voltage dividers, voltage reducers, or voltage translating circuits may also be utilized to accomplish the same function. A first end of resister R1 152 is connected to the analog input 132 of the precision increasing circuit 130 and receives the analog input signal from the digital-to-analog converter 100. A second end of resister R1 152 is connected to the analog output 134 and a first end of resister R2 154. A second end of resistor R2 154 is connected to a first end of resistor R3 156. A second end of resistor R3 156 is connected to a biasing voltage source 170.

In the illustrated embodiment, the biasing circuit 160 is a transistor switch. The transistor switch includes an NPN type transistor 162 with the base 164 of the transistor 162 being connected through an input resistor R4 165 to the biasing input 136. The emitter 166 of the transistor switch is connected to ground 180 and the collector 168 provides the biasing output signal and is electrically coupled to the second end of resister R2 154 and the first end of resistor R3 156.

In operation of this embodiment of the precision increasing circuit 130, an analog signal having a magnitude V is presented to the first end of resistor R1 152 and the biasing signal at the biasing input 136 is switched to the on or high voltage state (i.e., a bias disabled state). Thus, transistor 162 is in the on or fully saturated condition, essentially removing resistor R3 156 from the circuit and coupling the second end of resistor R2 154 to ground 180. The magnitude of the analog signal V is then divided between resistor R1 152 and resistor R2 154 and the analog output 134 can be determined as:

$$V_1 \text{ (analog output 134)} = (V*R2)/(R1+R2).$$

In this state, the output of the precision increasing circuit 130 will be limited to the range:

$$V_1 \min = (V\min * R2)/(R1+R2) \text{ and}$$

$$V_1 \max = (V\max * R2)/(R1+R2).$$

When the biasing signal at the biasing input 136 is switched to the off or low voltage state (i.e., a bias enable state), transistor 162 is in the off or open condition. In this state, the first end of resistor R3 156 is coupled to the second end of resistor R2 154. This results in allowing the biasing source Vbias 170 to shift the level of the analog signal at analog output 134. In this state, the biased state, the magnitude of the analog signal V is then divided between resistor R1 152 and resistors R2 154 and R3 156. The analog output 134 can be determined as:

$$V_2 \text{ (analog output 134)} = \text{Vbias} - ((\text{Vbias} - V)*(R2+R3)/(R1+R2+R3)).$$

In this state, the output of the precision increasing circuit 130 will be limited to the range:

$$V_2 \min = \text{Vbias} - ((\text{Vbias} - V\min)*(R2+R3)/(R1+R2+R3)) \text{ and}$$

$$V_2 \max = \text{Vbias} - ((\text{Vbias} - V\max)*(R2+R3)/(R1+R2+R3)).$$

Figure 4:
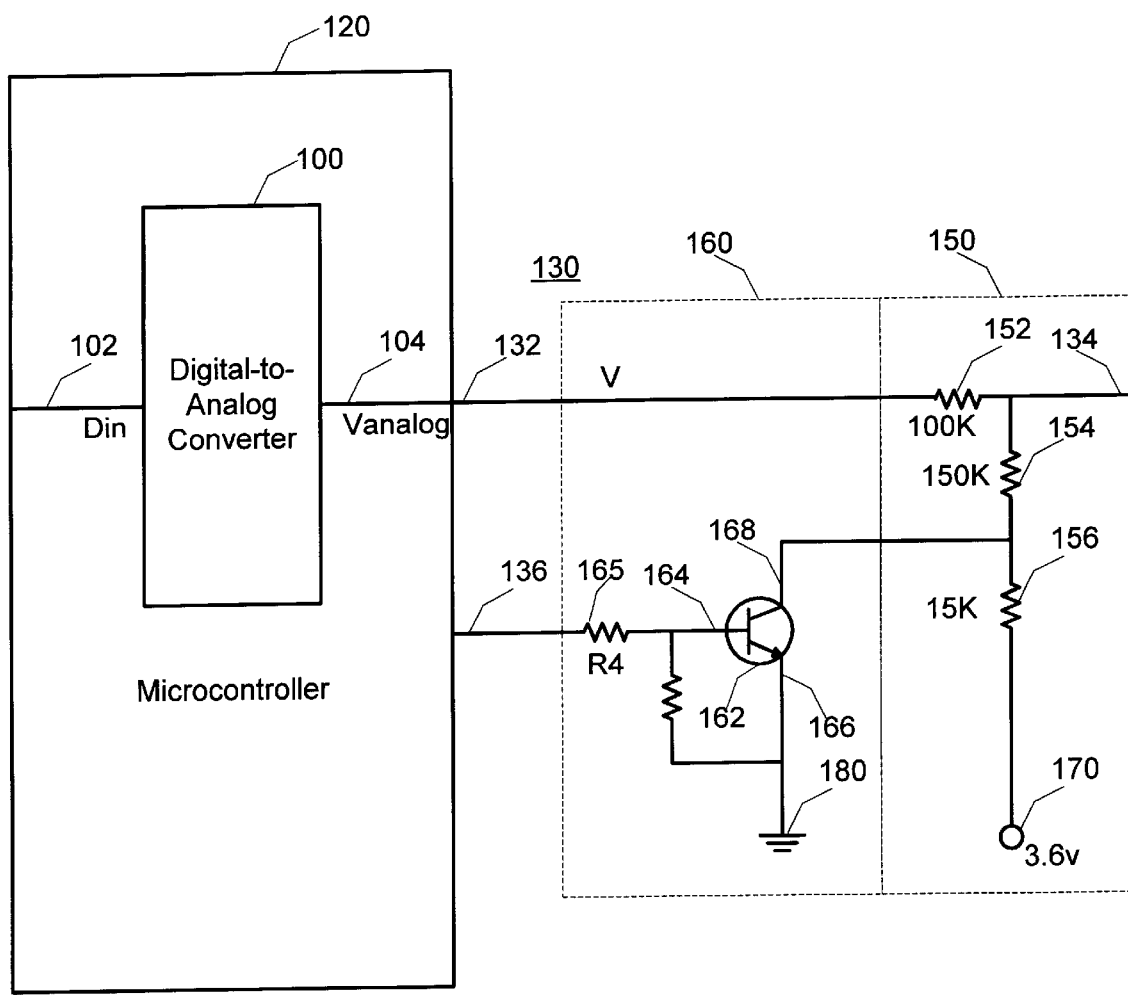
FIG. 4 is a circuit diagram illustrating a specific example of one possible implementation of the present invention.

To illustrate the operation of this embodiment of the present invention, a specific example is provided. FIG. 4 is a circuit diagram illustrating a specific example of one possible implementation of the present invention. Those skilled in the art will realize that this particular example is only one possible configuration of many possible configurations and the present invention should not be limited by this example. In this example, resistor R1 152 is 100 KΩ's, resistor R2 154 is 150K Ω's, and resistor R3 156 is 15KΩ's. The transistor switch 162 is a DTC114EE device or an equivalent. The analog signal V presented at the first end of resistor R1 152 ranges from Vmin=0.2 volts to Vmax=2.6 volts. The biasing source Vbias is 3.6 volts. When the biasing signal 136 is switched on, the output analog signal 134 is in the range of:

$$V_1 \min = (0.2*150K)/(100K+150K) = 0.12 \text{ volts, and}$$

$$V_1 \max = (2.6*150K)/(100K+150K) = 1.56 \text{ volts}.$$

When the biasing signal 136 is switched off, the output analog signal 134 is in the range of:

$$V_2 \min = 3.6 - (3.6 - 0.2)*(150K+15K)/(100K+150K+15K) = 1.483 \text{ volts, and}$$

$$V_2 \max = 3.6 - (3.6 - 2.6)*(150K+15K)/(100K+150K+15K) = 2.977 \text{ volts}.$$

The precision obtained by the present invention is easily determined by examining the ratio of the voltage for each range to the number of bits in the digital-to-analog converter. The lower range in the example illustrated in FIG. 4 is $V_1\max$ to $V_1\min$ or 1.44 volts. Given that an eight-bit digital-to-analog converter is being used, the precision obtained by the present invention for the lower range is 1.44 volts/$2^8$ or 5.65 mvolts/bit. The upper range in the example illustrated in FIG. 4 is $V_2\max$ to $V_2\min$ or 1.494 volts. Given that an eight-bit digital-to-analog converter is being used, the precision obtained by the present invention for the lower range is 1.494 volts/$2^8$ or 5.86 mvolts/bit. The digital-to-analog converter without utilizing the present invention has a precision of $(2.6-0.2)/2^8$ or 9.375 mvolts/bit. Thus, the precision obtained by utilizing the present invention is improved from 9.375 mvolts/bit to a worst case scenario of 5.86 mvolts/bit.

Figure 5:
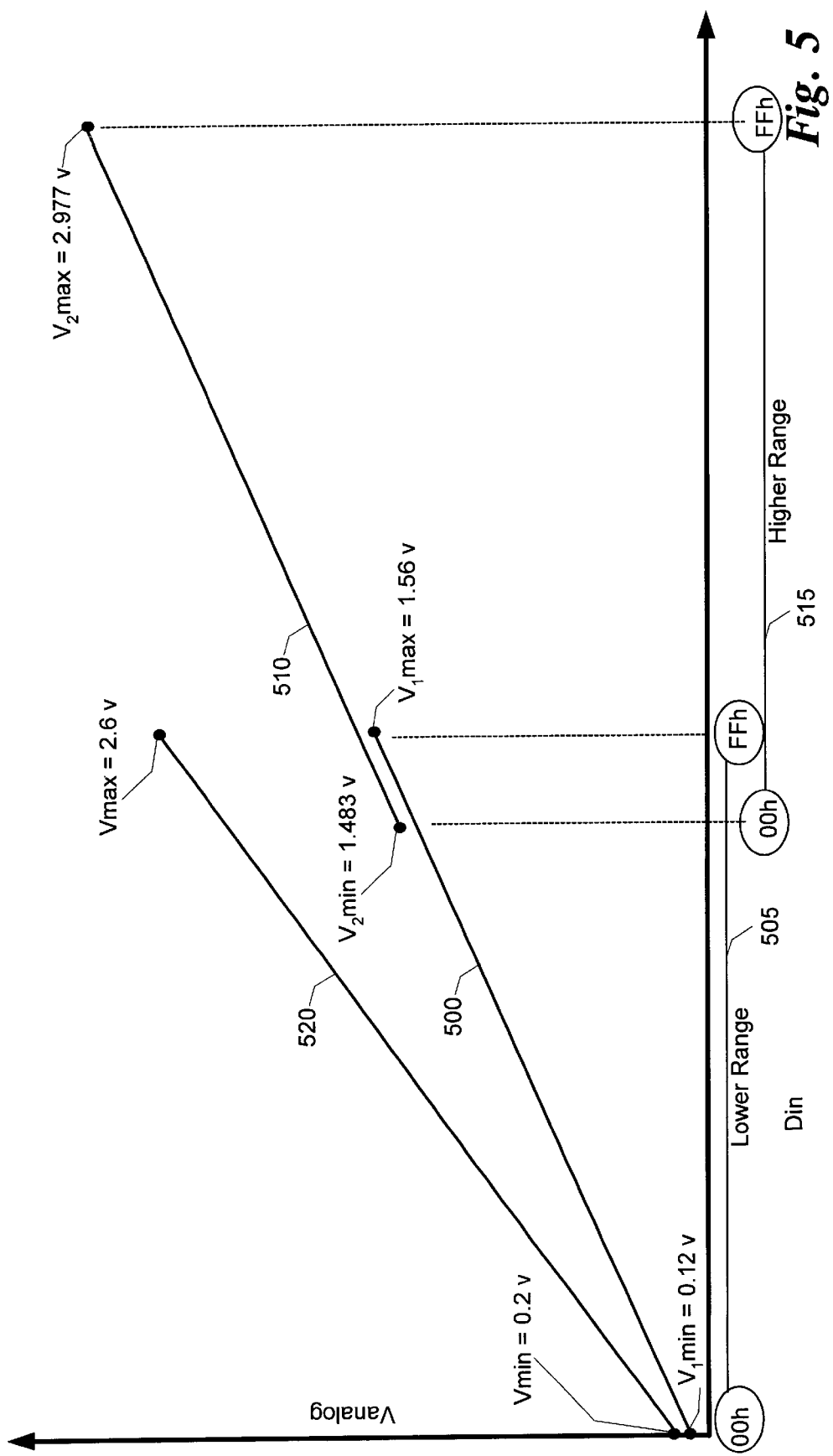
FIG. 5 is a diagram illustrating the operation of eight-bit digital-to-analog converter improved by the exemplary circuit of FIG. 4 along with an overlay of the operation of the eight-bit digital-to-analog converter without the benefit of the present invention.

FIG. 5 is a diagram illustrating the operation of the eight-bit digital-to-analog converter improved by the exemplary circuit of FIG. 4 along with an overlay of the operation of the eight-bit digital-to-analog converter without the benefit of the present invention. A first line 500 illustrates the operation of the exemplary circuit over the lower voltage range and a second line 510 illustrates the operation of the exemplary circuit over the higher voltage range. The axis depicting the digital input to the digital-to-analog converter is split into two sections - one for when the bias signal 136 is high (the lower range) 505 and one for when the bias signal 136 is low (the higher range 515). The operation of the eight-bit digital-to-analog converter without the benefit of the present invention is illustrated by a third line 520. The slope of this third line 520 is steeper than the slope of the first line 500 and the second line 510 due to the fact that the precision of the digital-to-analog conversion is lower without the benefit of the present invention. In a practical implementation of the present invention, it is desirable for the first line 500 and the second line 510 to slightly overlap to ensure continuous conversion.

In an alternate embodiment of the present invention, the bias voltage 170 can be adjustable. This aspect of the invention allows the precision of the circuit to be increased or decreased. In another embodiment of the present invention, multiple voltage dividers and biasing inputs could be utilized to provide for additional voltage ranges, thereby ever further increasing the precision of the digital-to-analog converter.

The present invention has been illustrated in relation to particular embodiments which are intended in all respects to be illustrative rather than restrictive. Those skilled in the art will recognize that the present invention is capable of many modifications and variations without departing from the scope of the invention. Accordingly, the scope of the present invention is described by the claims appended hereto and supported by the foregoing.

What is claimed is:

1. A circuit for increasing the precision of a digital-to-analog converter, the digital-to-analog converter being operative to generate an analog signal over a particular voltage range, the circuit comprising:

a voltage translating circuit having an analog signal input, a bias enabled input and an analog signal output;

a biasing enable circuit having bias select input and a bias enabled output, the bias enabled output being electrically coupled to the bias enable input of the voltage translating circuit, the bias select input being receptive to a multiple-state signal whereby when the multiple-state signal is in a first state, the biasing circuit operates to place the bias enabled output into a disabled state, and when the multiple-state signal is in a second state the biasing circuit operates to place the bias enable output into an enabled state;

the voltage translating circuit being operative to receive the state of the bias enable output on the bias enable input and, in response to the bias enable input being in the disabled state, being operative to confine the analog signal output to a lower voltage range, the lower voltage range coinciding with a portion of the particular voltage range and, in response to the bias enable output being in the enabled state, being operative to confine the analog signal output to a higher voltage range, the higher voltage range coinciding with a portion of the particular voltage range, whereby the full precision of the digital to analog converter can be applied to both the lower voltage range and the higher voltage range thereby increasing the precision of the digital-to-analog converter.

2. The circuit of claim 1, wherein the lower voltage range and the upper voltage range overlap such that the maximum voltage of the lower voltage range exceeds the minimum voltage of the higher voltage range.

3. The circuit of claim 1, wherein the voltage translating circuit comprises a voltage divider that receives a first analog signal at the analog signal input and provides a second analog signal to the analog signal output, the second analog signal being less than the first analog signal when the bias select input is in the first state.

4. The circuit of claim 1, wherein the voltage translating circuit comprises a voltage divider that receives a first analog signal at the analog signal input and provides a second analog signal to the analog signal output, the second analog signal being greater than the first analog signal when the bias select input is in the second state.

5. The circuit of claim 1, wherein when the bias select input is in the first state, the voltage translating circuit is operative to receive a first analog signal at the analog signal input and proportionately compress the magnitude of the first analog signal to create a second analog signal and to provide the second analog signal to the analog signal output.

6. The circuit of claim 1, wherein the voltage translating circuit includes a bias voltage source and when the bias select input is in the second state, the voltage translating circuit is operative to receive a first analog signal at the analog signal input and proportionately compress the magnitude of the first analog signal to create a second analog signal, to increase the magnitude of the second analog signal by the bias voltage source, and to provide the increased second analog signal to the analog signal output.

7. The circuit of claim 1, wherein the voltage divider comprises:
   a first resistor having a first terminal and a second terminal, the first terminal of the first resistor being electrically coupled to the analog signal input and the second terminal of the first resistor being electrically coupled to the analog signal output;
   a second resistor having a first terminal and a second terminal, the first terminal of the second resistor being coupled to the second terminal of the first resistor and the second terminal of the second resistor being coupled to the bias enable input; and
   a third resistor having a first terminal and a second terminal, the first terminal of the third resistor being coupled to the second terminal of the second resistor and the second terminal of the third resistor being coupled to a bias voltage source.

8. The circuit of claim 7, wherein the biasing circuit includes a switch having a switch input, a first terminal and a second terminal, the switch input of the switch being electrically coupled to the bias select input, the first terminal of the switch being electrically coupled to the second terminal of the second resistor and the first terminal of the third resistor and the second terminal of the switch being coupled to a source, and wherein when the bias select input is in a first state, the switch is closed thereby coupling the second terminal of the second resistor and the first terminal of the third resister to the source and when the bias select is in a second state, the switch is open effectively isolating the second terminal of the second resistor and the first terminal of the third resistor from the source.

9. The circuit of claim 8, wherein the switch comprises a transistor switch.

10. The circuit of claim 8, wherein the source is a ground.

11. The circuit of claim 8, wherein the bias voltage is variable.

12. A circuit for increasing the precision of a digital-to-analog converter, the circuit comprising:
   an N-bit digital-to-analog converter having a digital signal input and an analog signal output;
   a translating circuit having an analog signal input electrically coupled to the analog signal output of the N-bit digital-to-analog converter, an analog signal output and a bias enable input;
   the N-bit digital-to-analog converter being operative to receive an N-bit digital signal on the digital signal input, convert the N-bit digital signal into a first analog output signal having $2^N$ possible values over a first voltage range and providing the first analog output signal to the analog signal output of the N-bit digital-to-analog converter;
   the translating circuit, in response to the enable input being in a first state, being operative to translate the first analog output signal into a second analog voltage having $2^N$ possible values over a second voltage range, the second voltage range having a smaller maximum value than maximum value of the first voltage range;
   the translating circuit, in response to the enable input being in a second state, being operative to translate the first analog output signal into the second analog voltage having $2^N$ possible values over a third voltage range, the third voltage range having a larger minimum value than the minimum value of the first voltage range; and
   the translating circuit being operative to provide the second analog voltage to the analog signal output of the translating circuit.

* * * * *